(12) United States Patent
Nakamura et al.

(10) Patent No.: US 7,929,038 B2
(45) Date of Patent: Apr. 19, 2011

(54) CURRENT DRIVE-TYPE APPARATUS AND DISPLAY APPARATUS

(75) Inventors: Kohichi Nakamura, Kawasaki (JP); Somei Kawasaki, Saitama (JP)

(73) Assignee: Canon Kabushiki Kaisha, Tokyo (JP)

( * ) Notice: Subject to any disclaimer, the term of this patent is extended or adjusted under 35 U.S.C. 154(b) by 1191 days.

(21) Appl. No.: 11/559,555

(22) Filed: Nov. 14, 2006

(65) Prior Publication Data

US 2007/0120779 A1 May 31, 2007

(30) Foreign Application Priority Data

Nov. 16, 2005 (JP) ................. 2005-331599

(51) Int. Cl.
*H04N 5/222* (2006.01)
*H01J 63/04* (2006.01)
*G09G 3/30* (2006.01)
*H01L 27/14* (2006.01)
(52) U.S. Cl. ...................... 348/333.01; 313/506; 345/76; 345/80; 257/72
(58) Field of Classification Search ............. 348/333.01; 345/76, 80, 204; 257/72; 313/506, 509, 313/498
See application file for complete search history.

(56) References Cited

U.S. PATENT DOCUMENTS

| 5,656,825 | A | * | 8/1997 | Kusumoto et al. ............... 257/72 |
| 6,268,071 | B1 | | 7/2001 | Yasukawa et al. |
| 6,337,109 | B1 | | 1/2002 | Yamazaki et al. |
| 6,690,110 | B1 | * | 2/2004 | Yamada et al. ............... 313/506 |
| 7,230,593 | B2 | * | 6/2007 | Nakanishi ....................... 345/80 |
| 2002/0068372 | A1 | * | 6/2002 | Kunii ............................. 438/30 |
| 2003/0168966 | A1 | * | 9/2003 | Kobayashi et al. ........... 313/503 |
| 2004/0233147 | A1 | * | 11/2004 | Kawachi et al. ............... 345/82 |
| 2005/0200270 | A1 | * | 9/2005 | Kwak et al. ................... 313/502 |
| 2006/0139286 | A1 | * | 6/2006 | Kida et al. ...................... 345/98 |
| 2007/0120473 | A1 | * | 5/2007 | Nakamura et al. ............ 313/506 |
| 2007/0146245 | A1 | * | 6/2007 | Goden et al. ................... 345/76 |
| 2007/0146246 | A1 | * | 6/2007 | Nakamura et al. .............. 345/76 |

FOREIGN PATENT DOCUMENTS

| JP | 11-074074 | 3/1993 |
| JP | 09-082641 | 3/1997 |

* cited by examiner

*Primary Examiner* — Nhan T Tran
(74) *Attorney, Agent, or Firm* — Fitzpatrick, Cella, Harper & Scinto (57) ABSTRACT

A display apparatus includes a display area, in which pixels each including an EL device and a pixel circuit are arranged in a matrix on a substrate, and a column control circuit for controlling the pixel circuit column by column. The EL device is disposed between a lower pixel electrode and an upper transparent electrode on the substrate. The pixel electrode is electrically connected to the pixel circuit, and the transparent electrode is electrically connected to a common interconnecting line via a contact hole. The contact hole and the common interconnecting line are disposed to surround a periphery of the display area. The column control circuit is divided into two circuits one of which is disposed between the contact hole and the display area and the other of which is disposed outside the area between the contact hole and the display area.

7 Claims, 6 Drawing Sheets

PRIOR ART

CURRENT DRIVE-TYPE APPARATUS AND DISPLAY APPARATUS

FIELD OF THE INVENTION AND RELATED ART

The present invention relates to a current drive-type device, a display apparatus, and a camera which have an area in which a plurality of constituents, each including a current drive-type device and a device control circuit for controlling current passing through the current drive-type device, is disposed on a substrate. The present invention is suitably used in a display apparatus using an electroluminescence (EL) device which produces luminescence by injecting current therein.

In recent years, display apparatuses using EL devices have attracted attention as display apparatuses in place of a CRT or an LCD. Of these EL devices, application and development of an organic EL device, which is a light-emitting device of a current control-type, in which luminance is controlled by current flowing in the device, have been actively effected. In organic EL display including a peripheral circuit, a thin film transistor (TFT) is used in not only a display area but also in the peripheral circuit.

The TFT used in the peripheral circuit or a signal processing circuit is ordinarily a polysilicon TFT. The polysilicon TFT is produced through a low-temperature crystallization technology used for producing a high performance and inexpensive TFT for a peripheral drive circuit. A currently practical and typical crystallization technology is a low-temperature crystallization method using an excimer laser, and it is possible to form a good-quality silicon crystal thin film on a low melting point glass material (Japanese Laid-Open Patent Application (JP-A) Hei 09-082641).

Incidentally, the display apparatus using the organic EL device suffers from the occurrence of an area (dark spot) in which light is not emitted due to permeation or entrance of moisture or oxygen into the organic EL device or a deterioration in luminance. For this reason, a sealing technology for suppressing permeation of moisture or oxygen is required.

JP-A Hei 11-074074 discloses a technology in which a sealing plate to be disposed on an organic EL device with a predetermined spacing is fixed on a substrate with a sealing adhesive to hermetically seal a display area. As a method of decreasing the moisture permeation amount while enhancing the sealing ability in such a structure, the apparatus is constructed to prevent the ingress of ambient air into the EL device by increasing the width of the sealing adhesive. In this case, however, it is necessary to ensure that there is a certain margin from the substrate edge to an outer periphery of the sealing adhesive from the viewpoint of reliability. Further, the display area is located inside the sealing adhesive, so that when the width of the sealing adhesive is increased to enhance the sealing ability while keeping the outside shape of the panel, the resultant frame area is naturally increased, thus decreasing the area of the display area.

The display panel may preferably be lightweight and compact, so that a reduction in size of the frame portion is required, but it is difficult to achieve the frame size reduction in the above described conventional method.

Figure 4:
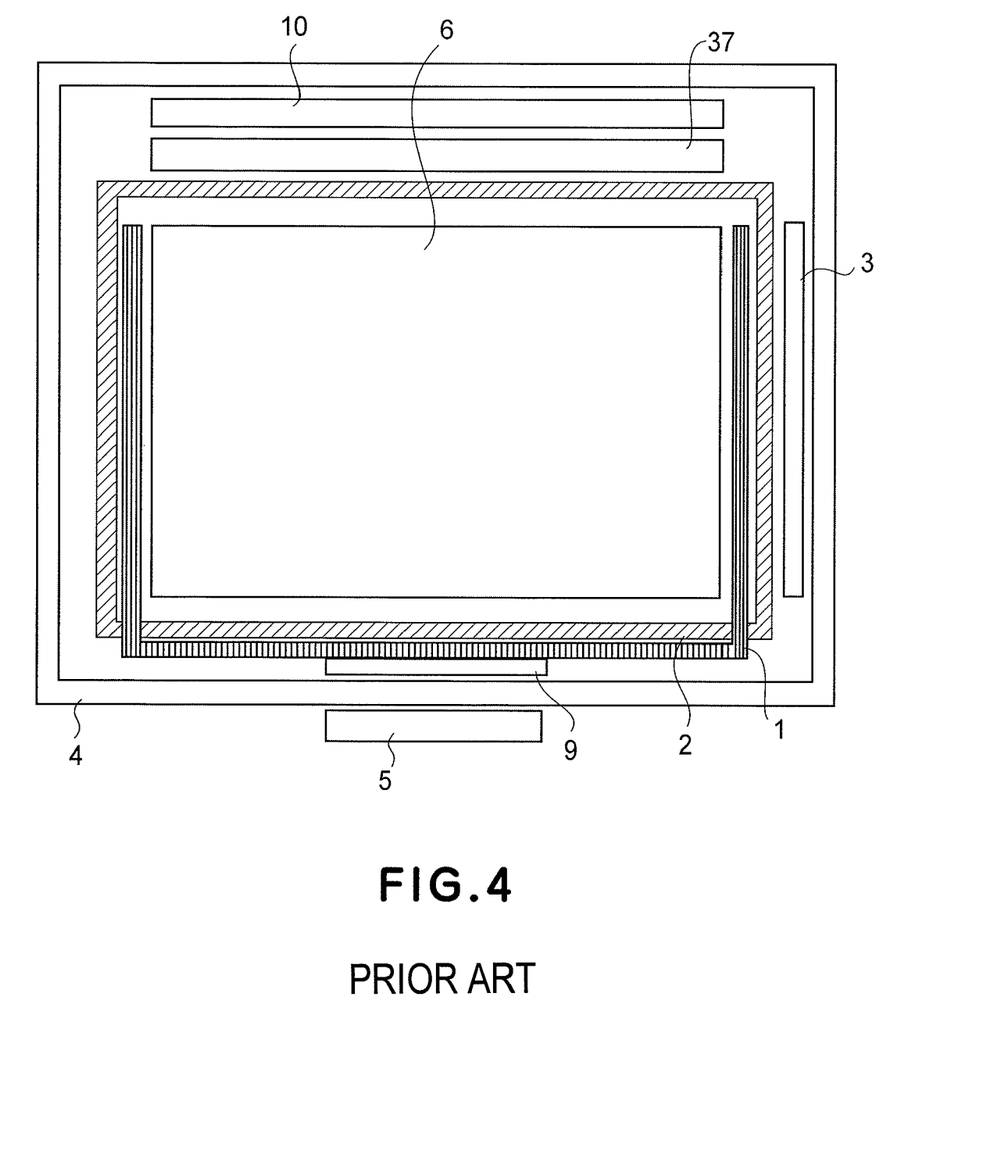
FIG. 4 is a schematic plan view for illustrating a conventional display apparatus.
Figure 5:
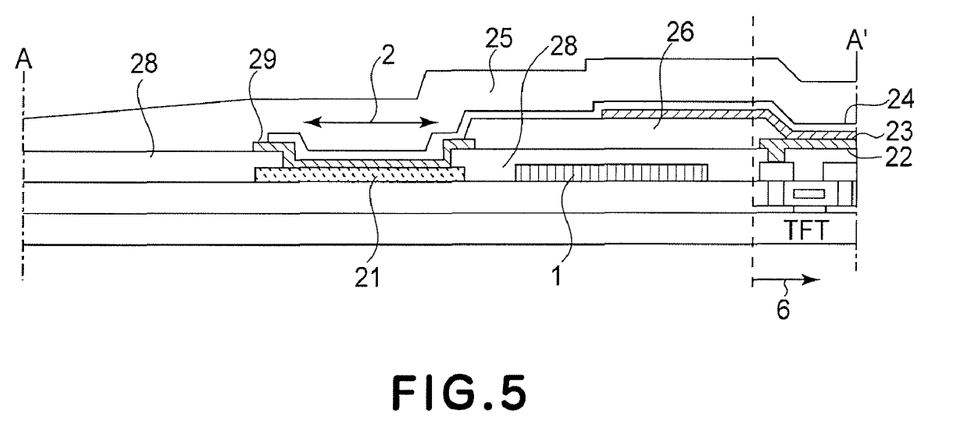
FIG. 5 is a schematic sectional view taken along A-A' line shown in FIG. 1.

FIG. 4 is a schematic view of an embodiment of a conventional display apparatus. The display apparatus shown in FIG. 4 includes a display area 6 in which EL devices and pixel circuits are arranged in a matrix and a contact hole 2 for connecting a transparent electrode, connected to an output of the EL device, to a common voltage line. Further, the display apparatus includes an external (connection) terminal 5, through which an image signal, a control signal, and power are externally supplied, and an adhesion area 4 for effecting adhesion of the sealing substrate. In the display apparatus, a column control circuit 37 for outputting a data signal to the pixel circuit is disposed outside the contact hole 2 with respect to the display area 6. The display apparatus further includes a scanning line drive circuit 3 for outputting a scanning signal to scanning lines for every row of pixels, a shift register 10 for generating a sampling signal to be outputted to the column control circuit 37, and an input circuit 9 for converting the inputted control signal into an operation voltage level in the display panel to be outputted. Further, the display apparatus includes a power supply line 1 for supplying power to the pixel circuit, and the power supply line 1 and the common voltage line are connected to the external terminal 5. Incidentally, interconnecting lines connected to the external terminal 5 are omitted in FIG. 4.

As described above, in the display panel in which the column control circuit 37 and the shift register 10 are disposed on an upper side (portion) of the display area 6, when the column control circuit 37 is disposed outside the contact hole 2, the distance between the display area 6 and the column control circuit 37 is large. As a result, the size of the frame portion of the display panel is increased.

SUMMARY OF THE INVENTION

An object of the present invention is to provide a display apparatus having a narrow frame portion by appropriately designing a circuit and wiring arrangement.

According to one aspect, the present invention provides a current drive-type apparatus, comprising:

a substrate on which a display area and a peripheral area are defined;

a current drive-type device and a device control circuit for controlling current passing through the current drive-type device, arranged in the display area;

a column control circuit for controlling the device control circuit, column by column, arranged in the peripheral area; and a common interconnecting line disposed in the peripheral area so as to surround the display area.

The current drive-type device is disposed between a lower first electrode and an upper second electrode. The first electrode is electrically connected to the device control circuit, and the second electrode is electrically connected to the common interconnecting line through a contact hole.

The column control circuit is divided into two circuits, one of which is disposed between the contact hole and the display area and the other of which is disposed outside the area between the contact hole and the display area.

According to the current drive-type apparatus of the present invention, in the area in which the column control circuit is disposed, it is possible to realize a small wiring and a small circuit area.

These and other objects, features and advantages of the present invention will become more apparent upon a consideration of the following description of the preferred embodiments of the present invention taken in conjunction with the accompanying drawings.

DETAILED DESCRIPTION OF THE PREFERRED EMBODIMENTS

As described above with reference to FIG. 4, when the column control circuit 37 is disposed outside the area between the contact hole 2 and the display area 6, the distance between the display area 6 and the column control circuit 37 is large, so that the increase in frame size is invited.

In the present invention, the column control circuit is divided into two column control circuits, one of which is disposed between the contact hole and the display area and the other of which is disposed outside the area between the contact hole and the display area, whereby the increase in frame size is suppressed.

However, when a circuit constituting portion with a high operation speed of the column control circuit 37 is disposed between the contact hole 2 and the display area 6, there is a possibility of a decrease in operation speed of the column control circuit 37 due to a parasitic capacitance caused between the circuit constituting portion and the transparent electrode. For this reason, it is desirable that, of the divided column control circuits, a circuit requiring a high operation speed is disposed outside the area between the contact hole and the display area, and a circuit not requiring a relatively high operation speed is disposed between the display area and the contact hole.

First Embodiment

Figure 1:
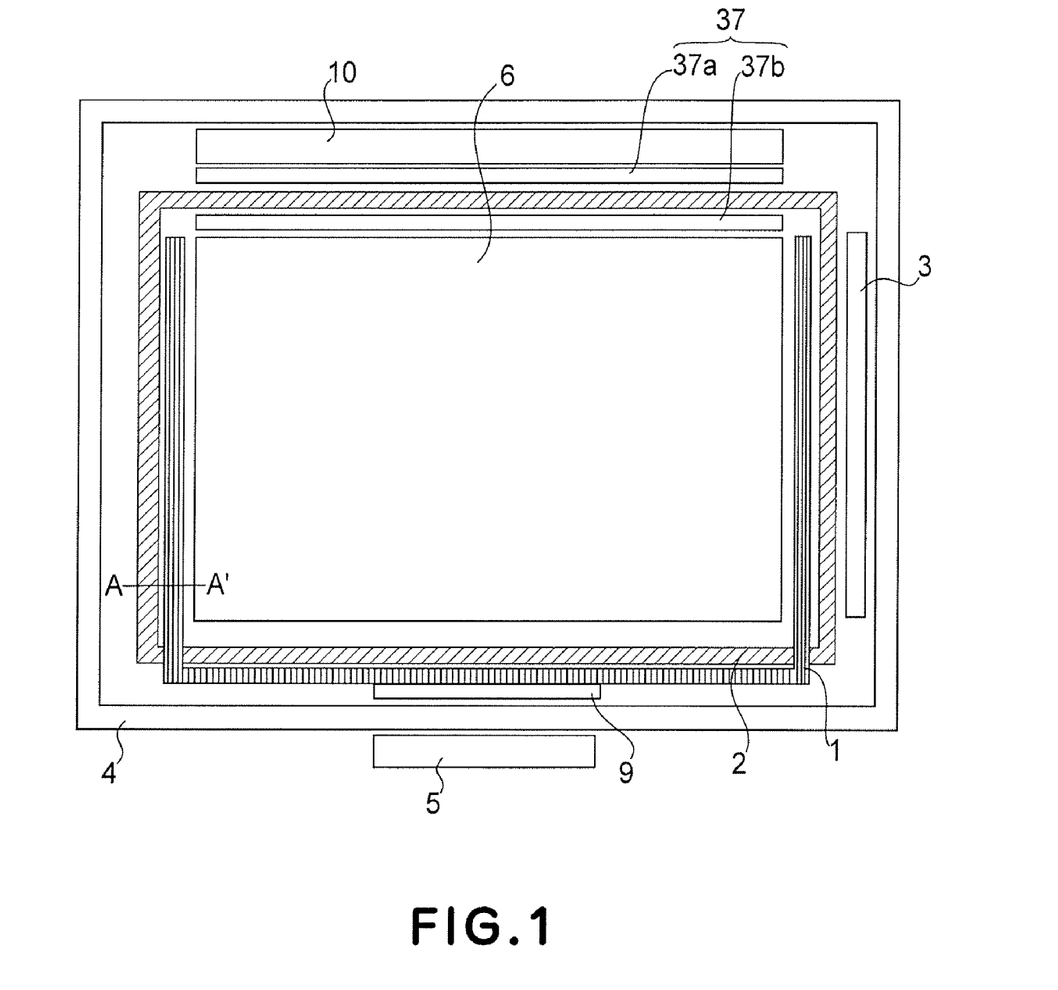
FIG. 1 is a schematic plan view for illustrating a display apparatus according to the present invention.

FIG. 1 shows a schematic layout of a display apparatus according to a First Embodiment of the present invention.

The display apparatus shown in FIG. 1 includes a display area 6 in which pixels (constituents) each comprising an EL device such as an organic EL device or the like and a pixel circuit (device control circuit) including a thin film transistor (TFT) are arranged in a matrix. The display apparatus further includes a contact hole 2 for connecting a transparent electrode connected to an output of the EL device with a common voltage line (common interconnecting line), an external terminal 5 through which an image signal, a control signal, and power are externally supplied, and an adhesion area 4 for effecting adhesion of a sealing plate (substrate).

In this embodiment, a column control circuit 37 for outputting a data signal to the pixel circuit is divided into two column control circuits which are disposed so that the contact hole 2 is sandwiched therebetween.

An arrangement method of the divided column control circuits will be described.

Although the operation of the column control circuit 37 is described later, the structure of the column control circuit is now described. It comprises a constituting block requiring a high operation speed and a constituting block not requiring a relatively high operation speed.

In a horizontal scanning period, a high operation speed is required in a circuit controlled by a signal with a pulse width smaller than the horizontal scanning period. On the other hand, a high operation speed is not required in a circuit controlled by a signal with a pulse width identical to the horizontal scanning period.

In FIG. 1, an inner side of an area surrounded by the contact hole 2, i.e., the side close to the display area 6, is an area in which a large parasitic capacitance is caused with respect to the transparent electrode.

In this embodiment, of the column control circuit 37, a circuit 37a requiring the high operation speed is disposed in an area outside the area between the contact hole 2 and the display area 6, and a circuit 37b that does not require the high operation speed is disposed in an area between the contact hole 2 and the display area 6.

By arranging the divided column control circuits as described above, it is possible to decrease the areas of a circuit area and a wiring area without lowering the operation speed of the circuit. As a result, on a side at which the column control circuit of the display apparatus is disposed, it is possible to decrease the frame size.

Figure 2:
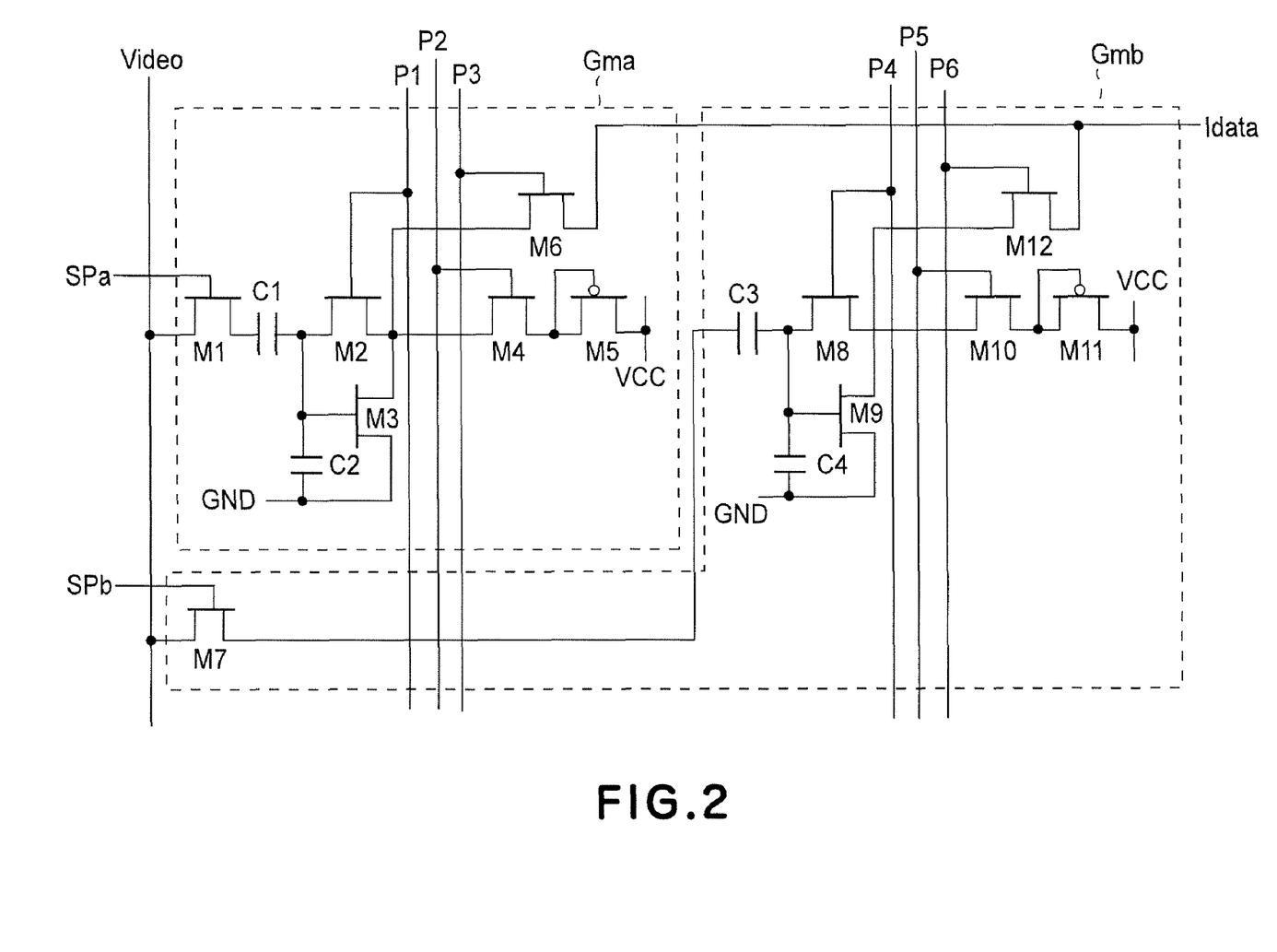
FIG. 2 is an embodiment of a circuit diagram of a column control circuit.

FIG. 2 shows a constitutional embodiment of the column control circuit.

In FIG. 2, reference characters M1 to M4, M6 to M10, and M12 represent an n-type TFT, reference characters M5 and M12 represent a p-type TFT, reference characters C1 to C4 represent capacitors, reference characters SPa and SPb represent sampling signals, reference characters VCC represent a power source, and reference characters P1 to P6 represent column control signals.

Figure 3:
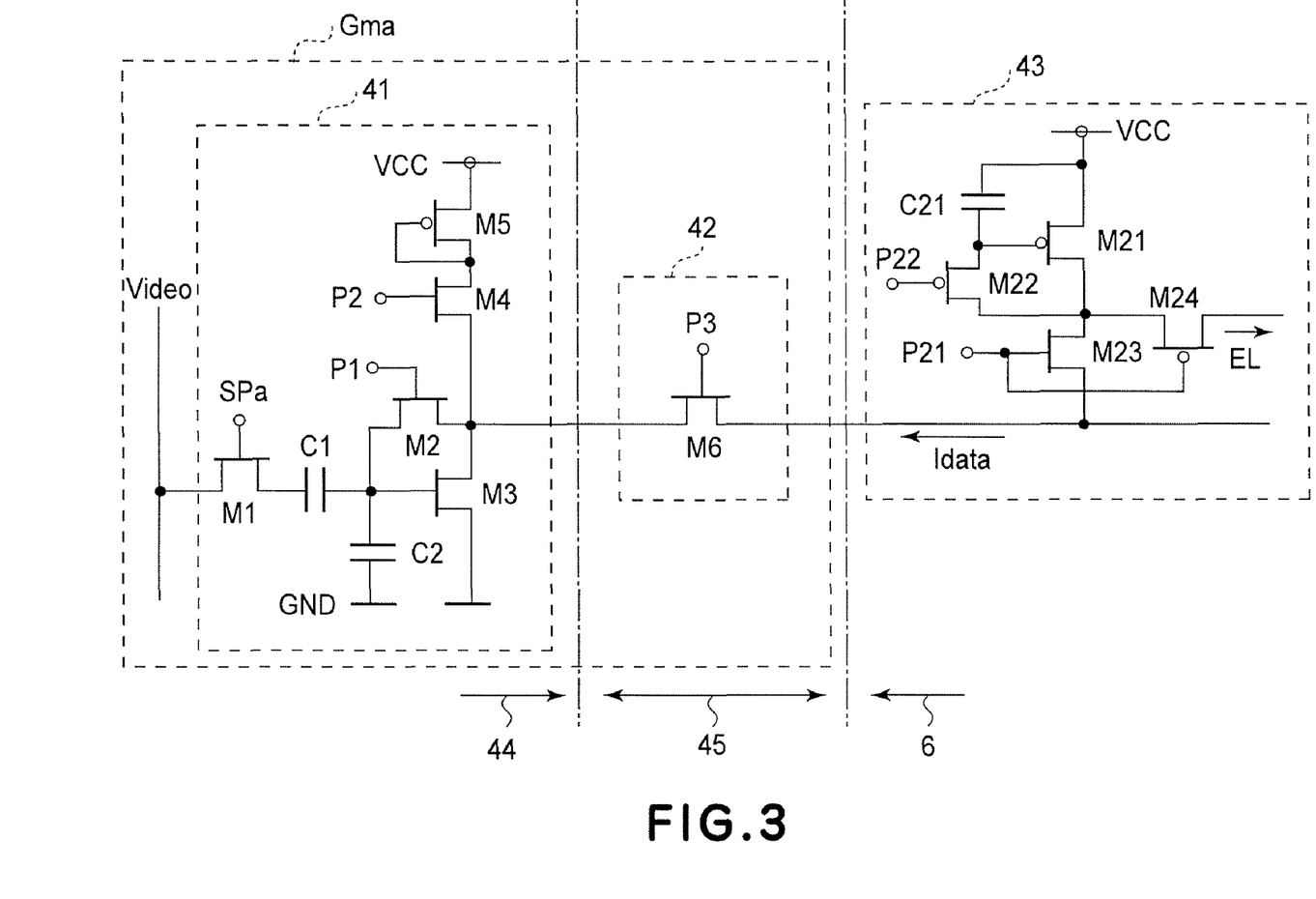
FIG. 3 is an embodiment of a circuit diagram for illustrating an arrangement method of divided column control circuits in the present invention.

FIG. 3 is a circuit diagram in which one column control circuit Gma is divided into a voltage-current conversion circuit 41 and a switch 42. The other column control circuit Gmb is also divided similarly. In FIG. 3, the reference numerals identical to those shown in FIG. 2 represent constituents of the circuit identical to those of the circuit shown in FIG. 2.

The voltage-current conversion circuit 41 acquires an input signal Video by receiving a sampling pulse SPa successively in the horizontal scanning period, and is controlled by signals SPa, P1 and P2 having pulse widths which are smaller than the horizontal scanning period. On the other hand, the switch 42 is controlled by a signal P3 having a pulse width identical to the horizontal scanning period. A high-speed circuit operation is required with respect to the voltage-current conversion circuit 41 but is not required with respect to the switch 42 relative to the voltage-current conversion circuit 41.

In FIGS. 1, 3, and 4, the area surrounded by the contact hole 2 is the area having a large parasitic capacitance with respect to the transparent electrode. In the embodiment shown in FIG. 3, the voltage-current conversion circuit 41 requiring a high operation speed is disposed in the area 44 located outside the area between the contact hole 2 and the display area 6, and the switch 42 not requiring a relatively high operation speed is disposed in the area 45 located between the contact hole 2 and the display area 6. By arranging the divided circuit and the switch as described above, without lowering the operation speed of the high operation speed circuit, the circuit area and a wiring area can be reduced in area. As a result, on a side where the column control circuit of the display apparatus is disposed, it is possible to decrease the frame size.

In FIG. 3, a pixel circuit 43 is also added. The pixel circuit 43 will be described.

Referring to FIG. 3, a source of a drive transistor M21 is connected to a power line VCC, a gate thereof is connected to a capacitor C21 and a source of a transistor M22, and a drain thereof is connected to an EL device EL via a transistor M24.

Control lines P21 and P22 switch a pixel circuit between a programming operation and a light-emitting operation so as to turn the respective transistors M22 to M24 on and off. More specifically, in the programming operation, the transistors M22 and M23 are turned on and the transistor M24 is turned off, whereby a current value is written in the capacitor C21. Current data I(data) flows into the transistor M21, in which the gate and the drain are short-circuited, via a data signal line and the transistor M23. As a result, a current value is written in the capacitor C21. In the light-emitting period, the transistors M22 and M23 are turned off and the transistor M24 is turned on. The current written in the capacitor C21 flows into the EL device EL via the transistor M21 to the transistor M24. Depending on the value of current flowing into the EL device EL, the EL device EL emits light.

Incidentally, in the display apparatus in this embodiment, the circuit constitutions shown in FIGS. 2 and 3 are described as examples but the present invention is not limited to these circuit constitutions.

Further, in the above description, as a luminescence setting method for the EL device constituting each pixel, the current setting (current drive) method is used. However, the present invention is not limited thereto but may also be, e.g., a voltage setting method.

Further, in the embodiment described above, current is passed through the EL device via the transistor constituting the pixel circuit for effecting current control and carried through the common voltage line. However, it is also possible to pass the current from the common voltage line to the EL device and carried through the transistor constituting the pixel circuit for effecting current control. For example, in the pixel circuit shown in FIG. 3, the transistor M21 is a PMOS transistor. However, it is also possible to employ such a constitution that an NMOS transistor is used as the transistor M21, a cathode-side portion of the EL device is connected to the transistor M24, an anode-side portion is connected to the common voltage line having a potential VCC, and the transistor M21 is connected to the power supply line which has been grounded.

The above-described display apparatus in the First Embodiment is a top emission-type EL display apparatus but the present invention is also applicable to an EL display apparatus of a bottom emission-type wherein light is emitted from a transparent substrate side where a pixel circuit is formed. In this case, a transparent electrode is used as the pixel electrode constituting a first electrode (lower layer) formed on a substrate. A second electrode (upper layer) may also be a transparent electrode. However, in the case of using reflected light, an electrode formed of metal material such as aluminum is used.

In the above description, the display apparatus using the EL device is described as an example but the present invention is not limited thereto. For example, the display apparatus may also be replaced with other display apparatuses so long as the present invention is applicable thereto.

Second Embodiment

The above described display apparatus of the First Embodiment is capable of constituting an information display apparatus which is an apparatus capable of realizing a mobile phone, a mobile computer, a still camera, a video camera, and a multifunction apparatus of these apparatuses. The information display apparatus includes an information input portion. For example, in the case of the mobile phone, the information input portion is constituted by containing an antenna. In the case of a PDA or the mobile computer, the input portion includes an interface portion for a network. In the case of the still camera or the video (movie) camera, the information input portion includes a sensor portion such as CCD or CMOS.

As a suitable embodiment, a digital camera using the display apparatus described in the First Embodiment is used in electronic equipment will be described.

Figure 6:
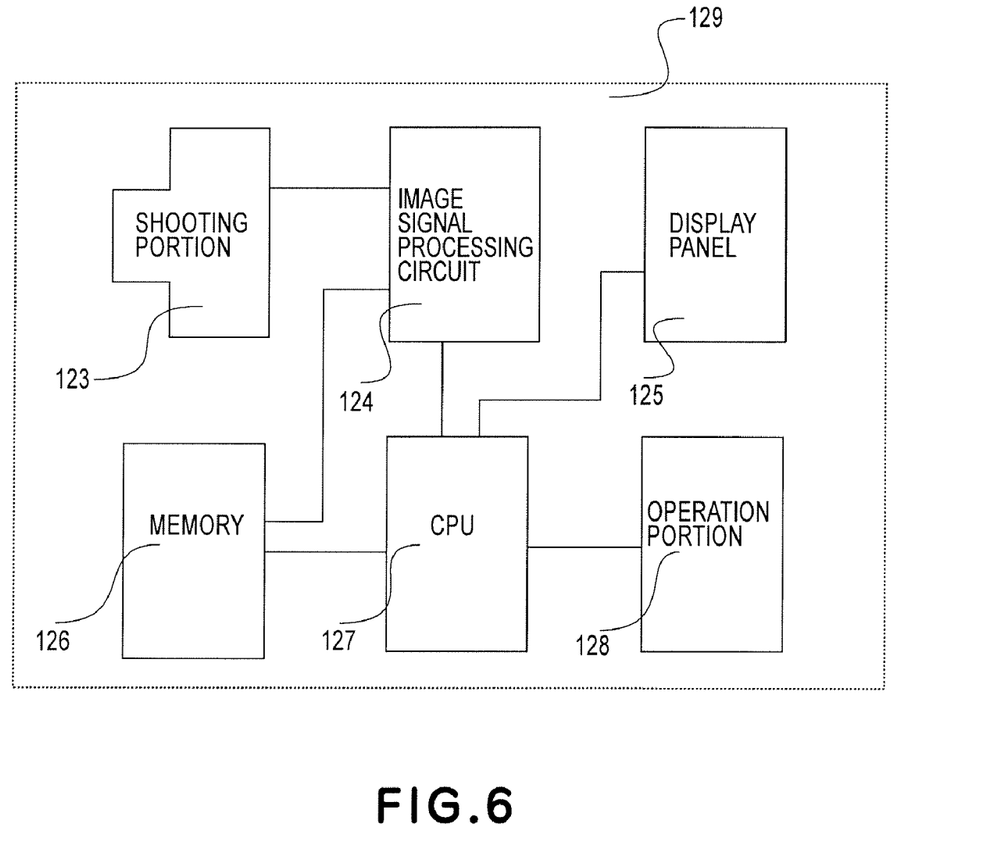
FIG. 6 is a block diagram showing an embodiment of a digital still camera.

FIG. 6 is a block diagram of an example thereof of a digital still camera. Referring to FIG. 6, an entire system 129 includes an image shooting portion 123 for shooting a subject, an image signal processing circuit 124, a display panel 125, a memory 126, a CPU 127, and an operation portion 128. An image which is shot by the shooting portion 123 or stored in the memory 126 is signal-processed by the image signal processing circuit 124, and is viewable by the display panel 125. The CPU 127 controls the shooting portion 123, the memory 126, the image signal processing circuit 124, and the like based on an input from the operation portion, thus effecting shooting, recording, reproduction, or display depending on situation.

As described hereinabove, according to the current drive-type apparatus of the present invention, it is possible to employ the EL device (constituting a current drive-type light-emitting device) represented by, e.g., an organic EL device, so that a display apparatus can be constituted by the current drive-type apparatus.

While the invention has been described with reference to the structures disclosed herein, it is not confined to the details set forth and this application is intended to cover such modifications or changes as may come within the purpose of the improvements or the scope of the following claims.

This application claims priority from Japanese Patent Application No. 331599/2005 filed Nov. 16, 2005, which is hereby incorporated by reference.

What is claimed is:

1. A current drive type apparatus, comprising:
a substrate having a display area and a peripheral area;
a current drive type device;
a device control circuit configured to control current passing through the current drive type device and being arranged in the display area;
a column control circuit configured to control the device control circuit, column by column, and being arranged in the peripheral area; and
a common interconnecting line being disposed in the peripheral area so as to surround the display area,
wherein the current drive type device is disposed between a lower first electrode and an upper second electrode, the first electrode being electrically connected to the device control circuit, and the second electrode being electrically connected to the common interconnecting line through a contact hole, and
wherein the column control circuit is divided into two circuits, one of which is disposed between the contact hole and the display area and the other of which is disposed in an outside area outside of the area between the contact hole and the display area.

2. An apparatus according to claim 1, wherein said apparatus further comprises a connection terminal disposed in the peripheral area configured to permit an external electric connection, and wherein the column control circuit is disposed in the peripheral area opposite to an area in which the connection terminal is disposed.

3. An apparatus according to claim 1, wherein the column control circuit comprises a voltage current conversion circuit disposed in the outside area.

4. An apparatus according to claim 1, wherein the column control circuit comprises a circuit, controlled by a pulse with a period shorter than a horizontal scanning period, disposed in the outside area.

5. A display apparatus comprising:
   a current drive type apparatus according to claim 1,
   wherein the current drive type device is a light emitting device.

6. An apparatus according to claim 5, wherein the light emitting device is an electroluminescence device.

7. A camera comprising:
   a display apparatus according to claim 5;
   a shooting portion configured to shoot a subject of shooting; and
   an image signal processing portion configured to process a signal of an image shot by said shooting portion,
   wherein said image signal processing portion processes an image signal so as to display an image by said display apparatus.

* * * * *